(12) United States Patent
Sommer et al.

(10) Patent No.: US 7,335,936 B2
(45) Date of Patent: Feb. 26, 2008

(54) DRAM MEMORY HAVING VERTICALLY ARRANGED SELECTION TRANSISTORS

(75) Inventors: Michael Sommer, Raubling (DE); Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 308 days.

(21) Appl. No.: 10/744,051

(22) Filed: Dec. 23, 2003

(65) Prior Publication Data

US 2004/0197989 A1 Oct. 7, 2004

(30) Foreign Application Priority Data

Dec. 23, 2002 (DE) ................. 102 60 770

(51) Int. Cl.
*H01L 29/72* (2006.01)
(52) U.S. Cl. .............. 257/301; 257/302; 257/309; 257/330; 257/401
(58) Field of Classification Search ................ 257/301, 257/302, 309, 330, 401
See application file for complete search history.

(56) References Cited

U.S. PATENT DOCUMENTS 5,561,308 A 10/1996 Kamata et al.
6,262,448 B1 7/2001 Enders et al.
6,363,484 B1 3/2002 Cordery et al.
6,406,970 B1 6/2002 Kudelka et al.
2003/0151068 A1* 8/2003 Ishibashi .................... 257/200

FOREIGN PATENT DOCUMENTS

DE 199 54 867 12/2000
DE 19954867 * 12/2000
DE 199 54 867 12/2002

OTHER PUBLICATIONS

German Examination Report dated Aug. 13, 2003.
Amendment filed Jun. 22, 2006 for U.S. Appl. No. 10/744,056.
Office Action from German Patent and Trademark Office dated Aug. 13, 2003.

* cited by examiner

*Primary Examiner*—Edward Wojciechowicz
(74) *Attorney, Agent, or Firm*—Patterson & Sheridan, L.L.P.

(57) ABSTRACT

Memory cell having a trench capacitor that is constructed in a lower region of a substantially perpendicular trench hole, and which comprises an inner and an outer electrode, a dielectric layer being arranged between the inner and the outer electrodes, a vertical selection transistor that has a substantially perpendicular channel region, which is constructed adjacent to an upper region of the trench hole and which connects the inner electrode of the trench capacitor to a bit line, it being possible to construct a conductive channel as a function of the potential of a word line in the channel region, the channel region partially enclosing the trench hole in its upper region, and the associated work line at least partially surrounding the channel region.

14 Claims, 10 Drawing Sheets

DRAM MEMORY HAVING VERTICALLY ARRANGED SELECTION TRANSISTORS

CROSS-REFERENCE TO RELATED APPLICATIONS

This application claims foreign priority benefits under 35 U.S.C. §119 to co-pending German patent application number 102 60 770.2-33, filed Dec. 23, 2002. This related patent application is herein incorporated by reference in its entirety.

BACKGROUND OF THE INVENTION

1. Field of the Invention

The invention relates to a memory cell having a vertical selection transistor, an arrangement of these memory cells, and a method for producing these memory cells.

2. Description of the Related Art

Information can be stored and read out again with the aid of rewritable semiconductor memories. In the case of a DRAM semiconductor memory, the information is stored in the form of a specific charge in a storage capacitor. Each DRAM memory cell in this case comprises a trench capacitor and a selection transistor. A charge that represents the information to be stored is stored in the trench capacitor. The selection transistor, by contrast, serves as a switch for the readin and/or readout operation. When the selection transistor of the memory cell is activated by means of the associated word line, the stored charge is transmitted to a bit line of the semiconductor memory. The voltage on the bit line can be evaluated via an evaluation circuit such that the charge stored in the trench capacitor can be detected as information.

The performance of such memory cells is fundamentally determined in this case both by the properties of the individual components themselves and by their interplay.

The continuous trend to ever more powerful memories increasingly necessitates higher integration densities of the semiconductor structures. In order in this case to reduce the areal requirement of DRAM memory cells, concepts associated with a vertically arranged selection transistor are increasingly being investigated.

DE 199 54 867 C1 discloses a DRAM cell arrangement and a method for producing it in the case of which a vertical selection transistor is provided. The known cell arrangement has a trench capacitor that is connected in the upper end region to a horizontally arranged source-drain region. Constructed in a fashion offset from the upper source-drain region is a lower source-drain region that is connected to a vertical connecting channel. The connecting channel is led upward from the lower source-drain region to the bit line. A gate region that constitutes a part of a word line is constructed parallel to the connecting channel. The known cell arrangement has the disadvantage that a relatively large area is required for constructing the memory cell.

U.S. Pat. No. 6,363,484 discloses a generic memory cell, a corresponding arrangement of memory cells and a method for producing such a memory cell. In the case of this known memory cell, a cylindrically shaped vertical selection transistor is constructed in the upper region of a trench hole. U.S. Pat. No. 6,406,970 B1 further discloses configuring trench holes both in trench-shaped and angular fashions.

SUMMARY OF THE INVENTION

It is therefore an object of the invention to provide a memory cell and a method for producing memory cells, the areal requirement of the memory cell further being reduced, and fast storage and readout of digital information being enabled. It is also an object of the invention to provide an arrangement of memory cells that permits a high packing density of the memory cells.

The memory cell according to the invention has a trench capacitor that is arranged in the lower region of a trench hole. The trench capacitor comprises an inner electrode and an outer counter-electrode, a dielectric layer being arranged between the inner electrode and the outer counter-electrode. The memory cell has a vertical selection transistor via whose channel region the inner electrode of the trench capacitor can be connected to a bit line. The channel region is guided through an associated work line to the bit line, it being possible to construct a conductive channel in the interior of the channel region as a function of the potential of the word line.

In the case of the memory cell according to the invention, the substantially vertical channel region is constructed along the horizontal cross section of the trench hole, and at least partially surrounds the trench hole in its upper region. The channel region is of large width by comparison with conventional solutions, owing to this inventive configuration of the memory cell. It is advantageous in this case that the large width also enlarges the cross section of the channel region, as a result of which the saturation current of the channel region, that is to say the maximum charge that can be transported per unit time into the memory cell or out of the memory cell, is increased. This, in turn, permits the memory cell to be written to and read from more rapidly. Consequently, this embodiment of the invention is advantageous in particular for those applications in which short access times in relation to information storage are important.

In the inventive solution, the channel region is guided through the associated word line such that the channel region is surrounded entirely or partially by the word line. With the aid of this geometry, it is possible for the channel region to serve as a source-drain path of the vertical selection transistor. By contrast with conventional field-effect transistors, the source-drain region can be surrounded here on all sides by the word line acting as gate electrode. The potential of the associated word line serves in this case for constructing a conductive channel in the channel region. By activating the word line, the channel region can be switched into the conductive state, and then connects the inner electrode of the trench capacitor to the associated bit line. The inventive solution of leading the channel region through the associated work line to the bit line constitutes the easy-to-produce embodiment of a vertical selection transistor. Because of the circumferentially arranged gate electrode, the inventive surrounded gate transistor has an increased current yield in the channel region such that the speed during writing and readout to and from the memory cell can be even further increased.

In accordance with the invention, the trench hole and the channel region have substantially rectangular cross sections. Regular arrangements of memory cells can thereby be realized in a particularly effective fashion. Because of the high regularity of such an arrangement, the trench capacitors can be increased further and above this by wet chemical re-etching (so-called bottling). Furthermore, a square or circular cross-sectional area Q permits optimum use of the chip area, a minimum cell size of 4.5 $F^2$ being achieved.

In a further advantageous development of the invention, a gate oxide layer is arranged between the semiconductor block and the associated word line entirely or at least partially surrounding the semiconductor block. The advantage of this is that it is possible thereby to construct a surrounded gate transistor in the case of which the semiconductor block is surrounded on all sides by the word line acting as gate electrode. It is possible for the memory cell to be written to and read from quickly via the conductive channel that can be thus produced.

The inventive arrangement comprises a multiplicity of memory cells M of the abovedescribed type. It is advantageous in this case when the trench holes are arranged in a regular arrangement of rows and columns. Such a regular arrangement can easily be produced using process engineering. Moreover, it is possible in the case of such a regular structure to additionally increase the capacitance of the trench holes by a step of wet chemical re-etching (so-called bottling). The higher capacitance enables a reliable storage of the information to be stored.

It is advantageous when the trench holes are arranged offset from one another seen in the bit line direction. This results in a structure that can be effectively mastered using production engineering and in the case of which the capacitance of the trench holes can additionally be increased by a step of wet chemical re-etching (so-called bottling). In this case, the bit lines can be designed as folded bit lines, the potential of a neighboring bit line being used in each case as reference potential for the readout operation. It is advantageous in this case that no external reference potential need be made available, and that the design of the array of memory cells is thereby simplified. A further advantage is that the bit lines need not be initialized with the aid of an external reference potential before readout, but need only be briefly shortcircuited. This accelerates the readout operation.

It is advantageous when the word lines are implemented as buried word lines that are arranged inside recesses etched into the silicon substrate. By contrast with word lines applied to the silicon substrate, buried word lines have the advantage that the isolations from the trench holes located therebelow, from the neighboring word lines and from the bit lines arranged thereabove can be structured very simply. A cover oxide layer serves for isolating from the trench holes, isolation trenches that are filled with insulating material serve for isolating from neighboring word lines, and an isolating cover layer likewise serves for isolating from the bit lines arranged above the word lines. A further advantage is that buried word lines have a large cross section and, to this extent, also a good conductivity, because the entire word line plane can be used to produce the word lines. The selection transistors can be activated quickly because of the high conductivity of such word lines.

In a further advantageous embodiment of the invention, the channel regions of the memory cells of two directly neighboring rows or columns are arranged on respectively opposite sides of the trench holes of the respective memory cells. Advantageous arrangements of the memory cells with a low space requirement per memory cell can be implemented thereby. On the other hand, memory cell arrays in which the channel regions are arranged on respectively the same side of the trench holes are advantageous, since a particularly regular arrangement of the memory cells is possible thereby.

In an advantageous development of the invention, the channel regions of memory cells of directly neighboring rows are arranged on an axis orthogonal to the bit line direction and centrally in relation to an associated word line. It is advantageous in this case that surrounded gate transistors can be produced thereby in a particularly simple fashion. Word lines that surround on all sides channel regions lying on an axis can be produced with the aid of rectilinearly running isolation trenches.

In a further advantageous development, zig-zag or sinuous isolation trenches are used for word line separation. It is possible as a result to implement particularly tightly packed arrangements of memory cells in the case of which directly neighboring memory cells whose channel regions are arranged very close to one another can be adequately isolated from one another.

In a further advantageous development of the invention, neighboring word lines are isolated from one another by isolation trenches. The width of the isolation trench directly determines the width of the word lines in this case. It is particularly advantageous here that the word line width, and thus the conductivity of the word lines, can be maximized by producing particularly narrow isolation trenches, for example with the aid of spacer technology. Furthermore, a cover oxide layer introduced into the recesses can be used as etching stop when producing the isolation trenches, the result being to simplify the production of mutually separated word lines.

BRIEF DESCRIPTION OF THE DRAWINGS

The invention is explained in more detail below with the aid of drawings, in which.

DETAILED DESCRIPTION OF THE PREFERRED EMBODIMENT

Figure 1:
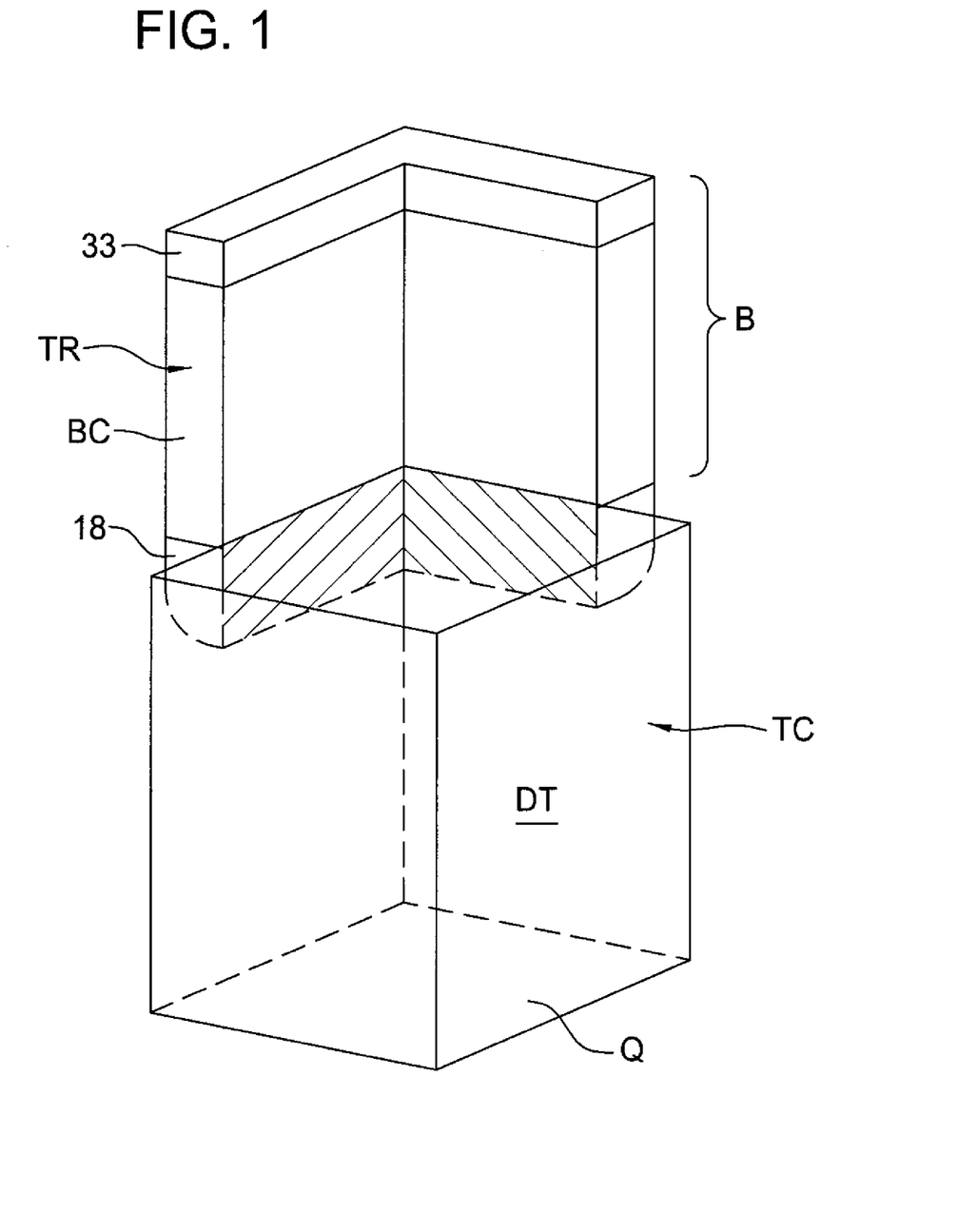
FIG. 1 shows a schematic of a memory cell having a perpendicular selection transistor.

FIG. 1 shows a schematic of the structure of a memory cell M according to the invention. Here, a trench hole DT having a square cross-sectional area Q is represented in perspective to illustrate the design. Constructed in the lower part of the trench hole DT is a trench capacitor TC whose outer electrode is preferably formed by a diffusion region (not illustrated here), and its inner electrode by an inner filling of the trench hole DT. The outer and the inner electrodes of the trench capacitor TC are electrically isolated from one another by a dielectric layer (not shown here). This layer is preferably constructed here as an oxide layer along the side walls of the trench hole DT and at the bottom of the trench hole DT. For a memory cell as shown in FIG. 1, the memory dielectric may extend from the trench hole bottom up to approximately ⅔ of the trench hole height. Because of the schematic illustration of FIG. 1, the relationships and distances shown therein are not reproduced in a fashion true to the original.

In order to charge or discharge the trench capacitor TC, the memory cell M has a vertical selection transistor TR that is constructed in an upper region of the trench hole DT. According to the invention, this selection transistor TR is constructed in FIG. 1 as a structure B partially enclosing the trench hole DT in its upper region. This design according to the invention permits an increased width of the conductive channel that can be constructed on the basis of the interaction with the surrounding word line WL in the channel region BC. Since the maximum charge per time unit that can be transported into or out of the trench capacitor TC via the channel region BC depends directly on the cross-sectional area of the conductive channel, and therefore on the width of the channel region BC, the saturation current of the channel region BC is also increased by the inventive concept. As a consequence of the high saturation current, the memory cell M according to the invention can be written to and read from particularly quickly by comparison with conventional memory cells having vertical selection transistors. The inventive concept is therefore particularly suitable for applications in which shorter access times are required.

The inventive selection transistor TR comprises two drain-source electrodes 18, 33 that are constructed as two diffusion regions in the semiconductor substrate, and a vertical channel region BC that interconnects the two diffusion regions 18, 33. The two diffusion regions 18, 33 and the channel region BC in FIG. 1 are preferably constructed in this case as a rectangular block along two side walls of the cuboid trench hole DT. Serving as control electrode here is a region of the word line WL (not shown here) directly surrounding the channel region BC and whose electric potential directly influences the charge carrier concentration in the channel region BC The upper one of the two drain-source electrodes 33 makes contact in this case with a bit line BL that is assigned to the memory cell M and is likewise not illustrated here in the interest of greater clarity. The lower one of the two drain-source electrodes 18 is constructed as a so-called buried strap and connects the channel region BC to the inner electrode of the trench capacitor TC arranged in a lower region of the trench hole DT.

In order to electrically isolate the channel region BC from the word line WL, a thin oxide layer GOX, the so-called gate oxide, is constructed on the side walls of the channel region BC (not shown here). By varying the composition and the thickness of this layer GOX, it is possible to achieve an optimum interaction between the channel region BC and the word line WL surrounding the channel region BC.

Figure 2A:
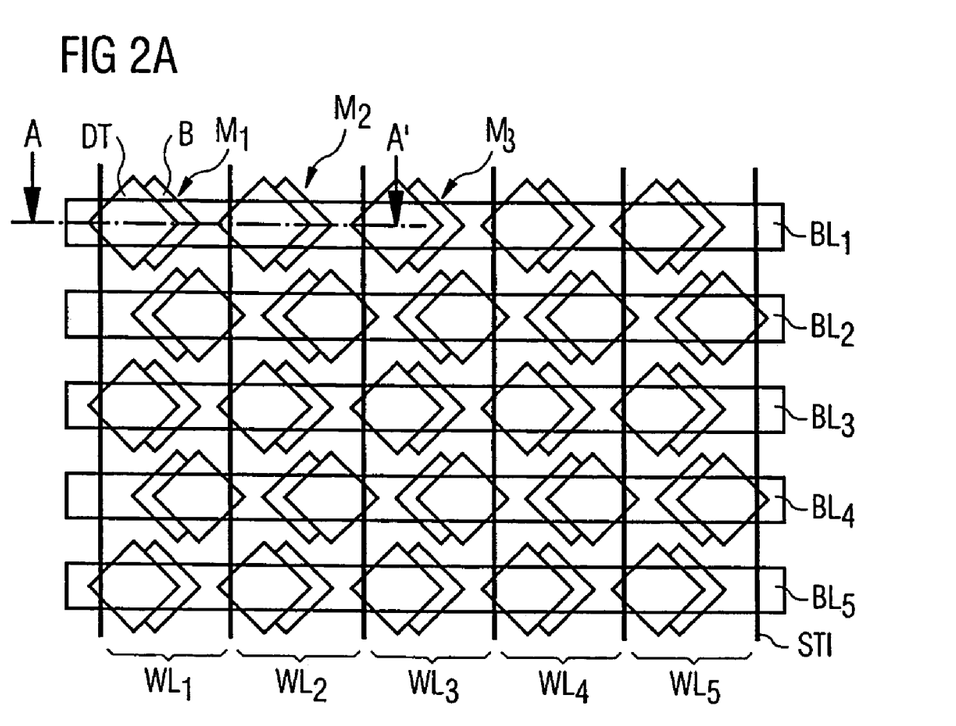
FIGS. 2A and 2B show a first variant layout of the invention having square trench holes.
Figure 2B:
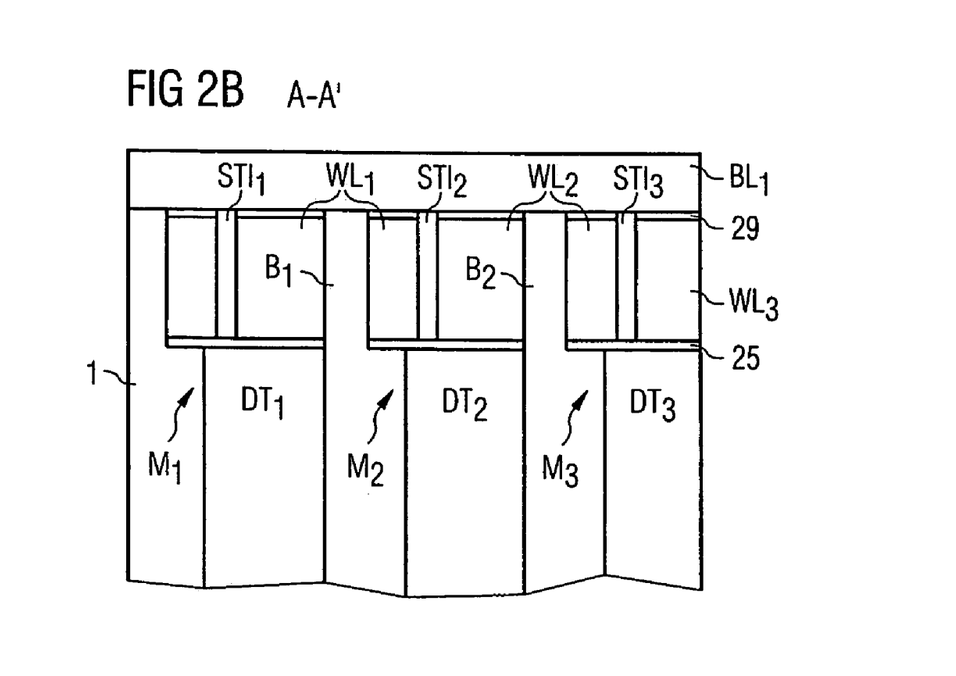

A first variant layout of an inventive arrangement of memory cells M is illustrated in plan view in FIGS. 2A and 2B. The memory cells M are arranged here in the form of a rectangular matrix in the shape of rows and columns. The directly neighboring rows are offset in this case such that a memory cell M of a first row is arranged approximately centrally relatively to the directly neighboring memory cells of the neighboring rows. In the example shown here, the trench holes DT have square cross-sectional areas Q, the limbs of their square cross-sectional areas being aligned preferably at approximately 45° to the bit line direction. The side length of the cross-sectional areas is approximately 1 F here, F denoting the minimum resolving width of the lithography used. This results in a cross-sectional area Q of approximately 1 $F^2$ for each of the trench holes DT. The space requirement of an individual memory cell M turns out to be very small because of the favorable inventive arrangement, and is at least 4.5 $F^2$.

However, according to the invention it is also possible to provide other trench holes DT having a rectangular cross-sectional area Q, and in the case of which the extent differs in the direction of word line and bit line. A relatively large circumference of the rectangular trench holes DT can be implemented with the aid of these variants, since given the same cross-sectional area Q of a rectangular trench hole DT the circumference is greater the greater the difference between the width and the length. Since the effective area of the trench capacitors TC also increases with the circumference of the trench holes DT, a large ratio of width to length results in a relatively high trench capacitance referred to the cell area.

It is possible in the case of a rectangular trench hole DT to implement a greater etching depth by comparison with a square trench hole DT of the exemplary embodiment shown. It is also possible in the case of further decreases in the dimension of the memory cell M to ensure a sufficiently high memory capacity of the trench holes DT by etching the trench holes DT to the appropriate depth.

In the first variant layout shown in FIG. 2A, each trench hole DT has a semiconductor block B that is arranged along two sides of the corresponding square trench hole DT. The semiconductor block B serves here as channel region BC of the selection transistor TC of the corresponding memory cell M. The semiconductor blocks B extend here over a subregion of the circumference of the respective trench hole DT, and in so doing partially enclose the trench hole DT. Each semiconductor block C extends vertically through the corresponding word lines WL up to the corresponding bit line BL. Each semiconductor block B is preferably surrounded in this case on all sides by the associated word line WL. Arranged between a semiconductor block B and the corresponding word line WL is a gate oxide layer (not shown here) that surrounds the semiconductor block B at its side walls and isolates it from the associated word line WL. A conductive channel 35 is constructed in each channel region BC as a function of the potential of the word line WL surrounding this channel region BC. The word line WL and, in particular, the region of the word line WL surrounding the semiconductor block B make the gate potential available for the channel 35 to be constructed inside the corresponding semiconductor block B. It is possible to this extent to talk of a vertical selection transistor TR with a circumferentially arranged gate electrode, or to talk of a "surrounded gate transistor".

Isolation trenches STI that insulate directly neighboring word lines WL from one another are constructed inside the layer of the buried word lines WL. The isolation trenches STI in this case run preferably rectilinearly in a direction orthogonal to the bit line direction, and in so doing define the word lines WL.

In the exemplary arrangement of the memory cells in FIG. 2A, the channel regions BC and the trench holes DT of the memory cells M are arranged substantially parallel to the bit line direction. The channel regions BC of memory cells M of a common bit line $BL_1$-$BL_5$ are arranged here on the same side of the respective trench holes DT. Furthermore, the channel regions BC of the memory cells M of two neighboring bit lines $BL_1$-$BL_5$ are arranged on respectively opposite sides of the trench holes DT. Because of the mutual offset of the memory cell rows and of the opposite arrangement of the channel regions BC of neighboring rows, as shown in FIG. 2A the channel regions BC lie substantially on an axis orthogonal to the bit line direction. As illustrated in the advantageous variant layout, the word lines $WL_1$-$WL_5$ run here in a preferably rectilinear fashion and enclose the channel regions BC arranged on the respective common axis, substantially in the middle. As a result, each channel region BC is surrounded on all sides by the respective word line $WL_1$-$WL_5$, and so the entire channel region can be used to produce the conductive channel 35. However, further variant layouts are also possible, and in their case, for example, the channel regions BC of the memory cells are arranged at an edge of the respective word line $WL_1$-$WL_5$, and are enclosed only partially thereby.

There is a direct relationship between the conductivity of the word lines $WL_1$-$WL_5$ and their width. In order to ensure a sufficiently high conductivity of the word lines $WL_1$-$WL_5$ in conjunction with the correspondingly close arrangement of the memory cell columns, the isolation trenches STI are preferably produced with the aid of so-called spacer techniques for the purpose of word line separation. It is possible in this case to implement isolation trench widths that are smaller than the minimum resolving width F of the production process employed. This narrowing of the isolation trenches STI results in larger widths for the word lines $WL_1$-$WL_5$ without an overall rise in the space requirement of the memory cells M. Consequently, the ohmic resistance of the word lines $WL_1$-$WL_5$ can advantageously be reduced, and this leads in the final analysis to the better performance of the memory cells M. As a rule, a lower word line resistance is also attended by a lower access time to the selected memory cell M with regard to the write or read accesses.

The semiconductor blocks B of the memory cells M are contact-connected directly by the bit lines $BL_1$-$BL_5$ at the substrate surface. The channel regions BC of the selection transistors TR are activated via the corresponding word lines $WL_1$-$WL_5$, while information is read from the memory cell M or information is read into the memory cell M via the corresponding bit line $BL_1$-$BL_5$. Since the semiconductor blocks B make contact above the word line upper edge with the respective associated bit line $BL_1$-$BL_5$, no room for separate bit line contact structures must be left free between the word lines $WL_1$-$WL_5$. Here, contact is made with the bit lines directly via the channel regions BC of the vertical selection transistors TR. To this extent, virtually the entire area available on the word line plane can be used for the word lines $WL_1$-$WL_5$, which can therefore have a larger width and thus a lower bulk resistance. The surrounded gate transistors according to the invention, which are activated by buried word lines WL can be used to reconcile advantageously with one another the opposing requirements for wide word lines $WL_1$-$WL_5$, on the one hand, and for a smaller space requirement of the memory cells M, on the other hand.

Because of various production problems such as, for example, difficulties in making contact between bit line contacts and bit lines, or undesired short circuits between bit line contacts and neighboring word lines, conventional bit line contact connections, which run through the word line as bit line contacts, are to be regarded as exceptionally critical with reference to yield. They are therefore considered to be "yield detractors" of the respective production process. Since a separate bit line contact connection running through the word line plane is eliminated in the case of the concept according to the invention, the abovenamed problems are avoided in the production process.

In the first variant layout shown in FIG. 2A, the trench holes DT are arranged in a regular arrangement of rows and columns. With such an arrangement of the memory cells M, relatively little weight attaches to small inaccuracies in mask adjustment, or to slight process tolerances. If the spacing of one memory cell M from its neighboring cells is substantially the same size, the trench capacitance can be increased if required by means of so-called "bottling", that is to say by means of wet chemical re-etching. It is therefore possible even in the case of small cell dimensions to make available a sufficiently large trench capacitance that ensures reliable data storage.

The semiconductor blocks B of the cell array shown in FIG. 2A have side lengths with an extent of approximately 1.5 F. A relatively large width therefore results for these semiconductor blocks B. The semiconductor blocks B serving as channel regions BC of the selection transistors TR have a high so-called current yield because of this large width and the channel width associated therewith. Consequently, a particularly short access time results for write or read access to the memory cells M, and so the memory cells M can be written to and read from particularly quickly via the bit lines $BL_1$-$BL_5$. This concept is therefore suitable, in particular, for applications where it is important to access at high speed for writing or reading.

FIG. 2B shows a section along the line A-A' through the memory cell arrangement illustrated in FIG. 2A. The line A-A' runs here along the bit line $BL_1$ and encloses a total of three memory cells $M_1$-$M_3$. Each of the memory cells $M_1$-$M_3$ illustrated schematically in FIG. 2B has a semiconductor block $B_1$-$B_3$ that is constructed along the circumference of the respective trench hole $DT_1$-$DT_3$ and extends through the respectively buried word line $WL_1$-$WL_5$ up to above the bit line BL, constructed above the word line plane. The trench capacitor TC arranged in the lower region of the respective trench hole $DT_1$-$DT_3$ can be contact-connected via the semiconductor block $B_1$-$B_3$. Arranged between the semiconductor block $B_1$-$B_3$ and the word line $WL_1$-$WL_5$ surrounding this semiconductor block $B_1$-$B_3$ is a gate oxide layer GOX that separates the word line $WL_1$-$WL_5$, surrounding the channel region BC and serving as gate electrode, from the channel region BC arranged inside the semiconductor block $B_1$-$B_3$. A thin isolator layer 29 is arranged in each case between the individual word lines $WL_1$-$WL_5$ and the bit line $BL_1$ in order to isolate the word lines $WL_1$-$WL_5$ from the bit line $BL_1$. The word lines $WL_1$-$WL_5$ are isolated by a cover oxide layer 25 from the trench holes $DT_1$-$DT_3$ located therebelow.

In order to be able to reliably activate the conductive channel 35 inside each of the semiconductor blocks $B_1$-$B_3$, the corresponding word line $WL_1$-$WL_5$ must be of wider design than the outer extent of the respective semiconductor block $B_1$-$B_3$ in the bit line direction, and therefore also wider than the diameter of the trench holes $DT_1$-$DT_3$. As FIG. 2B shows, the buried word lines $WL_1$-$WL_3$ in each case run right and left next to the corresponding semiconductor blocks $B_1$-$B_3$. They are isolated from the neighboring word lines $WL_1$-$WL_3$ by the isolation trenches $STI_1$-$STI_3$. The cover oxide layer 25 serves the purpose of electrically isolating the word lines $WL_1$-$WL_3$ from the trench holes $DT_1$-$DT_3$ arranged therebelow, and from the substrate 1.

Figure 3A:
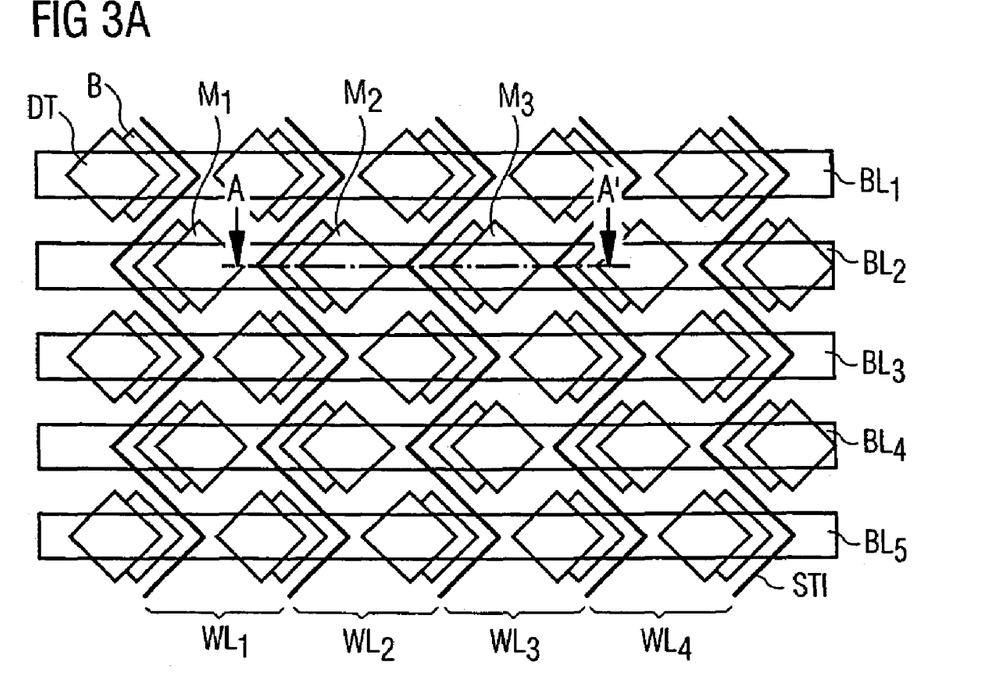
FIGS. 3A and 3B show a second variant layout of the invention having square trench holes.
Figure 3B:
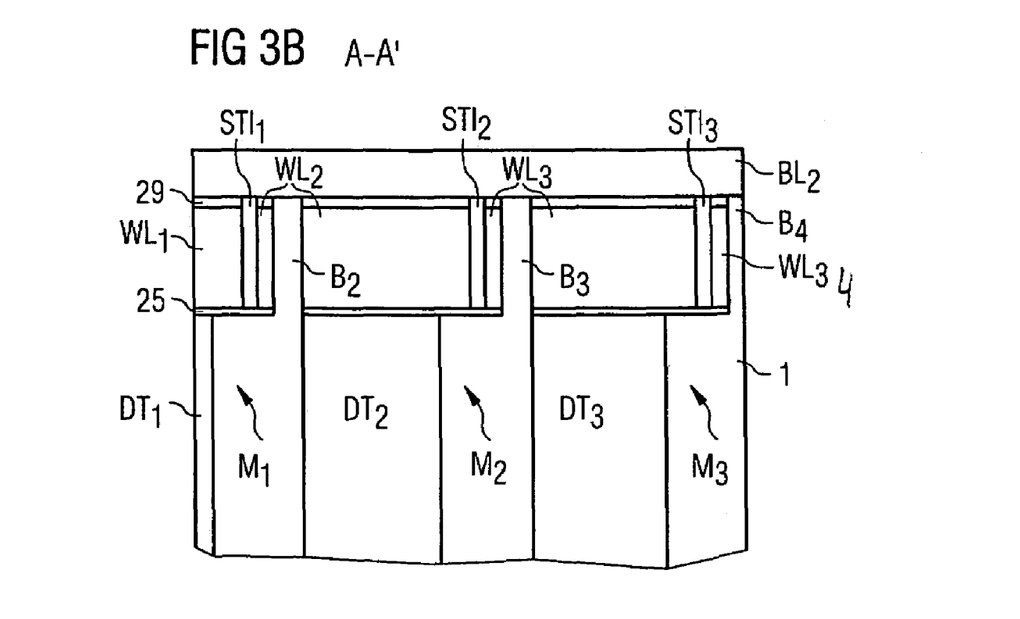

A second variant layout for an arrangement according to the invention of 25 memory cells M is illustrated by way of example in FIGS. 3A and 3B, and in this case the rows of the trench holes DT oriented in the bit line direction are offset from one another by analogy with FIG. 2A. The trench holes DT likewise have here a square cross-sectional area Q with a side length of approximately 1 F. According to the invention, by analogy with the first variant layout in FIGS. 2A and 2B the semiconductor blocks B forming the channel regions BC of the respective selection transistors TR are constructed along the circumference of the corresponding trench holes DT.

By contrast with the first variant layout from FIG. 2A, the word lines $WL_1$-$WL_4$ are formed by isolation trenches STI that are constructed in a zig-zag fashion and run between the directly neighboring channel regions BC of memory cells M of a word line $WL_1$-$WL_4$. If the entire width of a channel region BC is to be used to construct a conductive channel 35, the entire channel region BC must be surrounded by the associated word line $WL_1$-$WL_4$. Here, the isolation trenches STI advantageously run in each case precisely in the middle between two neighboring memory cells M of a row without touching the channel regions BC of the memory cells M.

In order to prevent the isolation trenches STI from touching the channel regions BC, and so that the channel regions BC are surrounded only incompletely by the respective word lines $WL_1$-$WL_4$, it may be necessary to fashion the spacings of the memory cells M in the bit line direction to be somewhat larger by comparison with the first variant layout. This is shown in FIG. 3A.

The mutually offset arrangement of the memory cells M, the memory cells M of arrow being arranged in each case centrally in the word line direction between two memory cells M of a directly neighboring row, and the word lines being formed by zig-zag isolation trenches STI, likewise permits a high packing density and thus a low space requirement overall per memory cell M. As with the first variant layout, this space requirement is approximately 4.5 $F^2$.

It is advantageous in the case of the zig-zag isolation trenches STI running between the memory cells that the isolation trenches STI do not run directly above the trench holes DT, and can therefore be expanded even more deeply into the substrate in order to be able more effectively to separate neighboring memory cells M from one another.

FIG. 3B shows a sectional view through the memory cell arrangement in accordance with the second variant layout, shown in FIG. 3A, along the line A-A'. The sectional view comprises four memory cells $M_1$-$M_4$ that are arranged by analogy with FIG. 2B along a common bit line $BL_2$. Each of the memory cells $M_1$-$M_4$ respectively has a semiconductor block $B_1$-$B_4$ that is constructed along the circumference of the corresponding trench hole $DT_1$-$DT_4$ and makes contact with the common bit line $BL_2$. Each semiconductor block $B_1$-$B_4$ is surrounded here by a dedicated associated word line $WL_1$-$WL_4$, a gate oxide layer GOX being constructed in each case between the respective semiconductor block $B_1$-$B_4$ and the corresponding word line $WL_1$-$WL_4$. Neighboring word lines $WL_1$-$WL_4$ are isolated from one another by isolation trenches $STI_1$-$STI_3$. The word lines $WL_1$-$WL_4$ are isolated by the cover oxide layer 25 from the trench holes $DT_1$-$DT_4$ located therebelow, and in each case have a thin isolation layer 29 with the aid of which the word lines $WL_1$-$WL_4$ are isolated from the bit line $BL_1$.

Figure 4A:
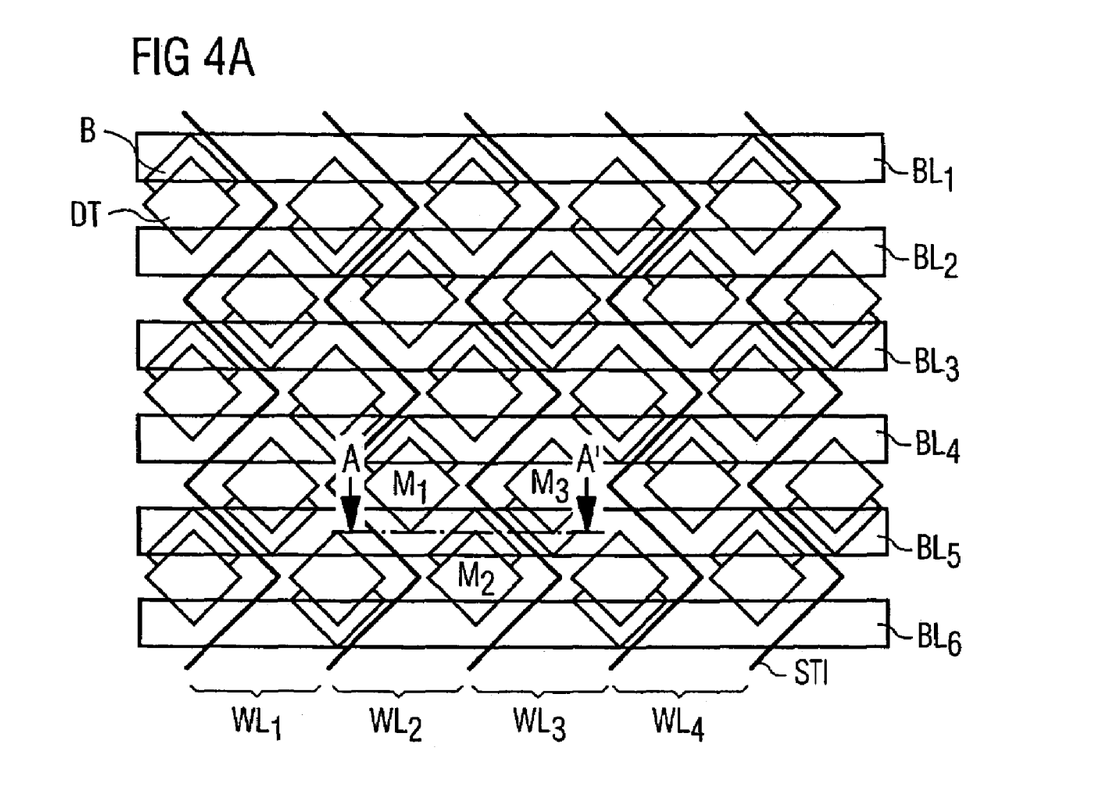
FIGS. 4A and 4B show a third variant layout of the invention having square trench holes.
Figure 4B:
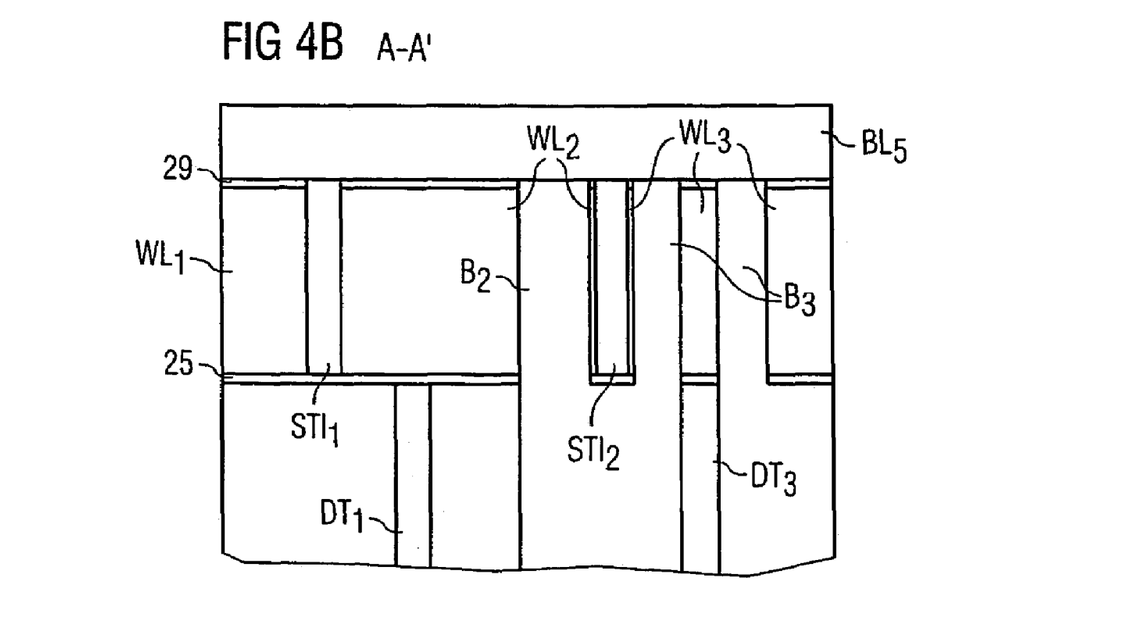

A third variant layout with the memory cells M according to the invention is illustrated in FIGS. 4A and 4B. By analogy with the arrangements of FIGS. 2A and 3A, the memory cells M are arranged here in matrix form in rows and columns, the rows being offset from one another. By contrast with the two previous arrangements, the semiconductor blocks B and the trench holes DT of the memory cells M are arranged relative to one another in this variant layout on an axis orthogonal to the bit line direction. As may be seen in FIG. 4A, in the bit line direction the memory cells M have here an alternating arrangement of the semiconductor blocks B and the trench holes relative to one another, and so the semiconductor blocks B of in each case two memory cells M of two neighboring cells are arranged close by one another.

Here, the bit lines $BL_1$-$BL_6$ preferably run in each case between the trench holes DT of two neighboring rows and thus above the semiconductor blocks B of these two rows. Each second memory cell M of a first and a second row thereby makes contact with a bit line $BL_1$-$BL_6$.

The word lines $WL_1$-$WL_4$ of the arrangement are formed by isolation trenches STI running in a zig-zag fashion. As shown in FIG. 4A, the isolation trenches STI alternately run here directly between trench holes DT and semiconductor blocks B of the memory cells M.

FIG. 4B shows a sectional view through the memory cell arrangement in accordance with the third variant layout, shown in FIG. 4A, along the line A-A'. The sectional view comprises three memory cells $M_1$-$M_3$ that are arranged along the bit line direction, the first and the third memory cell $M_1$, $M_3$ being assigned to a first row, and the second memory cell $M_2$ being assigned to a second row. Arranged above the memory cells $M_1$-$M_3$ is a bit line $BL_5$ that runs between the two rows. The bit line $BL_5$ makes contact in this case with the semiconductor blocks $B_2$ and $B_3$ of the memory cells $M_2$ and $M_3$.

Each of the semiconductor blocks $B_1$-$B_3$ of the memory cells $M_1$-$M_3$ is respectively constructed on two side walls of the corresponding trench hole $DT_1$-$DT_3$. Each semiconductor block $B_1$-$B_3$ is enclosed in this case by a dedicated associated word line $WL_2$, $WL_3$, preferably on both sides, a gate oxide layer GOX being constructed in each case between the respective semiconductor block $B_1$-$B_3$ and the corresponding word line $WL_2$, $WL_3$. The neighboring word lines $WL_2$-$WL_3$ are isolated from one another by means of an isolation trench $STI_1$. The word lines $WL_1$-$WL_3$ are isolated by means of the cover oxide layer 25 from the substrate 1 located therebelow and from the trench holes $DT_1$-$DT_3$, and in each case have a thin isolation layer 29 with the aid of which the word lines $WL_1$-$WL_3$ are isolated from the bit line $BL_5$.

In order to be able to make full use as channel regions BC of the semiconductor blocks $B_1$-$B_3$, arranged very tightly next to one another, of two neighboring memory cells $M_1$-$M_3$, it is preferably provided to enclose the entire semiconductor block $B_1$-$B_3$ of a memory cell $M_1$-$M_3$ by the associated word line $WL_2$, $WL_3$. Isolation trenches $STI_1$, $STI_2$ provided with the aid of a spacer technique are preferably used for this purpose. As shown in FIG. 4B, the isolation trenches $STI_2$ thus produced have a very small width, and so word line material still adequately surrounds the semiconductor blocks $B_2$, $B_3$.

Figure 5A:
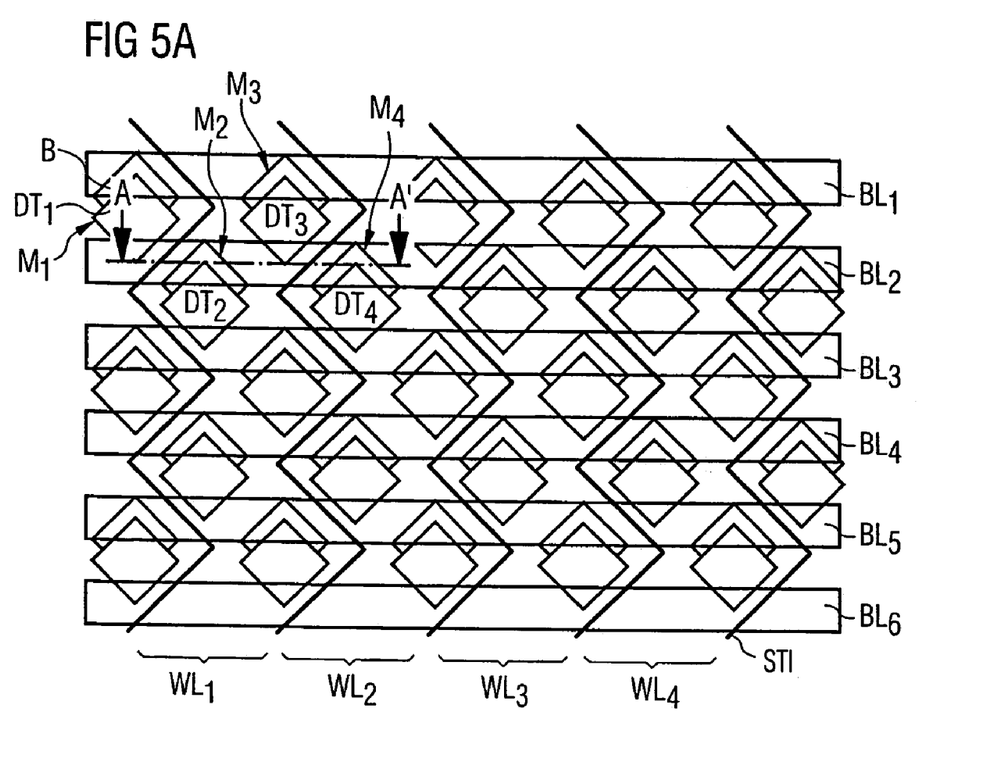
FIGS. 5A and 5B show a fourth variant layout of the invention having square trench holes.
Figure 5B:
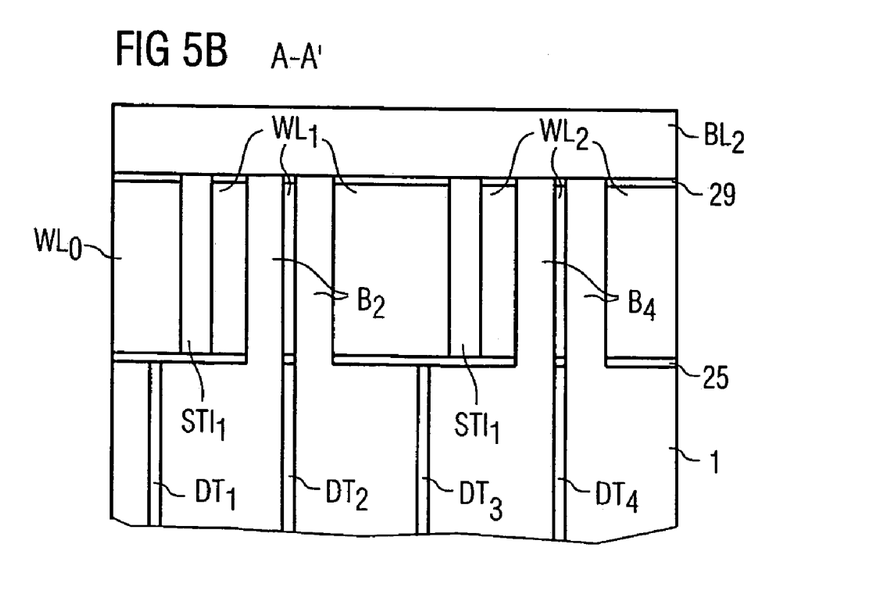

A fourth variant layout with the memory cells M according to the invention is illustrated in FIGS. 5A and 5B. As is the case in the previously described variant layouts, the memory cells M in this case have a square cross section and are arranged in matrix form in rows and columns, the rows being offset from one another. By analogy with the third variant layout illustrated in FIGS. 4A and 4B, the semiconductor blocks B and the trench holes DT of the memory cells M are arranged relative to one another in FIG. 5A on an axis orthogonal to the bit line direction. By contrast with the arrangement of FIG. 4A, the semiconductor blocks B of all the memory cells M are arranged on the same side of the corresponding trench holes DT. Consequently, the semiconductor blocks B of all the memory cells M of a row make contact with an associated bit line $BL_1$-$BL_6$ that respectively run between the trench holes DT of two rows above the semiconductor blocks B of one of these rows.

The word lines $WL_1$-$WL_4$ are formed by isolation trenches STI that run in a zig-zag fashion, the isolation trenches running in each case between a trench hole and a semiconductor block of two neighboring memory cells M of two neighboring rows.

FIG. 5B shows a sectional view through the memory cell arrangement in accordance with the fourth variant layout, shown in FIG. 5A, along the line A-A'. Here, the sectional view encloses four memory cells $M_1$-$M_4$ that are arranged along the bit line direction, the first and the third memory cells $M_1$, $M_3$ being assigned to a first row, and the second and fourth memory cells $M_2$, $M_4$ being assigned to a second row. Arranged above the memory cells $M_1$-$M_4$ is a bit line $BL_2$ that runs between the two rows. The bit line $BL_2$ makes contact in this case only with the semiconductor blocks $B_2$ and $B_4$ of the memory cells $M_2$ and $M_4$. The semiconductor blocks $B_1$ and $B_3$ of the memory cells $M_1$ and $M_3$ are in contact with the bit line $BL_1$.

Each of the semiconductor blocks $B_1$-$B_4$ of the memory cells $M_1$-$M_4$ is constructed in this case on two side walls of the corresponding trench hole $DT_1$-$DT_4$. The semiconductor blocks $B_1$-$B_4$ are preferably enclosed in this case on both sides by assigned word lines $WL_0$-$WL_2$, a gate oxide layer GOX being constructed in this case between the respective semiconductor block $B_1$-$B_4$ and the corresponding word line $WL_0$-$WL_2$. The neighboring word lines $WL_0$-$WL_2$ are isolated from one another by means of isolation trenches $STI_1$, $STI_2$. The word lines $WL_0$-$WL_2$ are isolated by means of a cover oxide layer 25 from the substrate 1 located therebelow and the trench holes $DT_1$-$DT_4$. A thin isolation layer 29 is constructed between the word lines $WL_0$-$WL_2$ and the bit line $BL_5$ in order to isolate the word lines $WL_0$-$WL_2$ and the bit line $BL_2$.

An isolation trench structure arranged below the plane of the word lines WL can be provided in all variant layouts in order to prevent crosstalk between the buried strap regions 18 of neighboring memory cells M. Isolation trenches can be arranged for this purpose in a horizontal and/or in a vertical direction between the buried strap regions 18 (not shown here). It is likewise conceivable to widen the word line isolation trenches STI into the semiconductor substrate 1, in order to isolate the buried strap regions 18 from one another in the bit line direction of neighboring memory cells M.

Because of the regular arrangement of all the variant layouts illustrated here, the extent of the trench holes DT in the bit and word line directions can be varied to a relatively large extent. To this extent, both the memory capacity and the current yield of the channel regions BC can be set within wide ranges.

Alternatively, the variant layouts shown, in which the isolation trenches STI run in a zig-zag fashion relative to the word line separation, can also have isolation trenches STI constructed in sinuous form. It is likewise within the scope of the invention for the cross sections Q of memory cells M also to have rectangular, rounded or circular trench holes DT.

The method according to the invention is explained below by way of example with the aid of drawings of the production method of a memory cell M in accordance with the second variant layout shown in FIG. 3A.

Figure 6A:
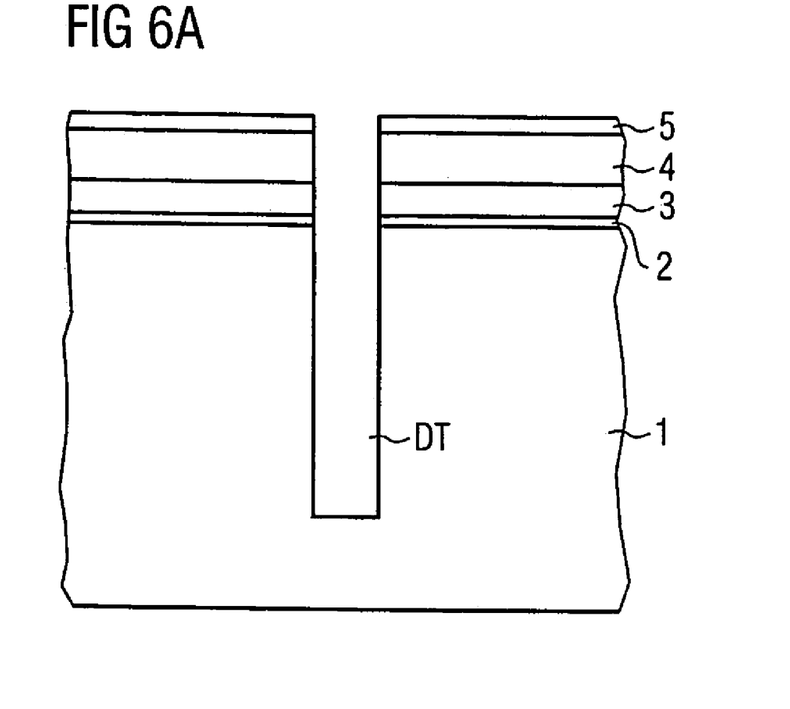
FIGS. 6A to 6L show individual method steps of the method according to the invention.

A weakly p-doped silicon wafer serves as starting point for producing an arrangement of memory cells M according to the invention. The silicon must be etched from the trench holes DT in a first step. As illustrated in FIG. 6A, an etching mask is applied to a silicon substrate 1 for this purpose. The etching mask preferably consists of a thermal oxide layer 2, a nitride layer 3 and a further oxide layer 4, preferably made from borosilicate glass, deposited by means of chemical vapor deposition (CVD). Whereas the thermal oxide layer 2 is only approximately 5 nm thick, the nitride layer 3 has a thickness of preferably 200 nm. The thickness of the oxide layer 4 is preferably approximately 1000 nm.

A photoresist layer 5 is applied to this etching mask, exposed by means of a lithographic etching method and subsequently etched. Etched out of the photoresist 5 in this process are areas that correspond substantially to the cross-sectional area Q of a trench hole DT. Thereafter, both the layers 2, 3, 4 and the silicon substrate 1 are etched down to a prescribed depth in order to produce trench holes DT in this way. This state of the method is shown in FIG. 6A.

Figure 6B:
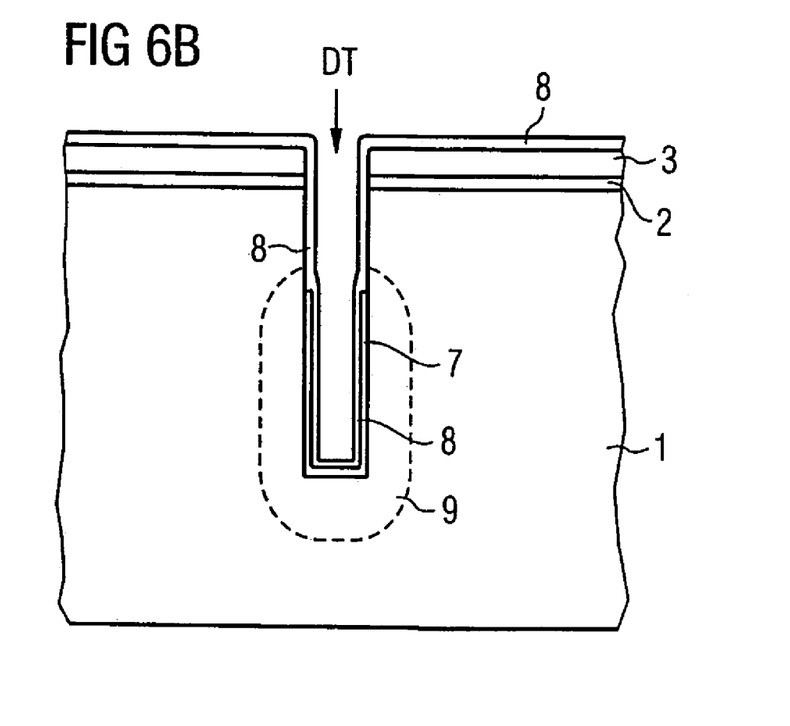

Both the photoresist layer 5 and the oxide layer 4 are removed again. The aim below is now to form the counter-electrode 11 (buried plate) of the trench capacitor TC. An arsenic-doped oxide layer 7 is deposited for this purpose by means of CVD (Chemical Vapor Deposition). This arsenic-doped oxide layer 7 is then etched back down to a first depth in a first recess step. A further oxide layer 8 is applied thereupon by means of CVD. In an outdiffusion process following thereupon, an n-doped zone 9 is produced in the p-doped silicon substrate 1 in the neighborhood of the arsenic-doped oxide layer 7 around the lower trench region. The n-doped zone 9 is also denoted as "buried plate" and serves as counter-electrode of the trench capacitor. This state of the method is illustrated in FIG. 6B.

Figure 6C:
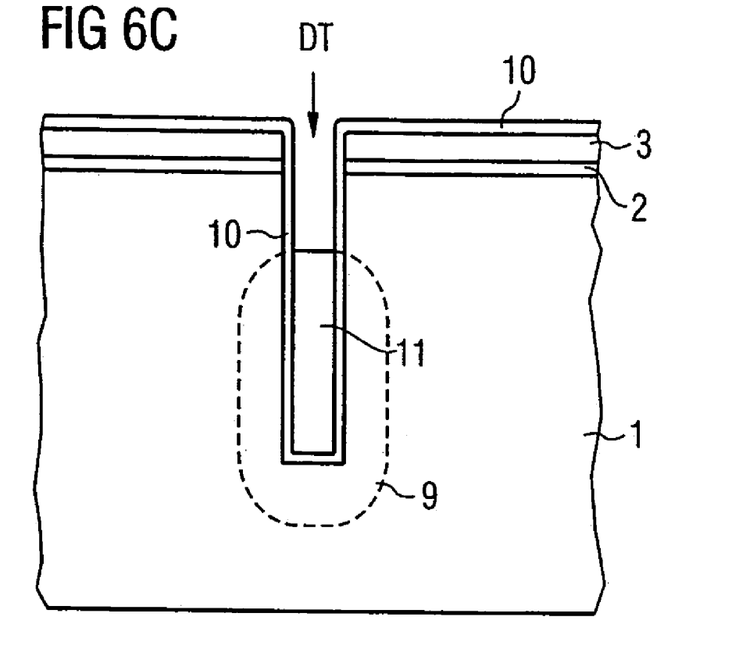

After the removal of the oxide layer 8 and the arsenic-doped oxide layer 7, a dielectric layer 10 is applied on the inner side of the trench hole DT. The dielectric layer 10 is preferably a nitride oxide layer having a thickness of about 5 nm. The dielectric layer 10 subsequently serves as a dielectric of the storage capacitor TC. The lower region of the trench hole DT is filled with a first polysilicon 11. For this purpose, firstly the entire trench hole DT is filled with n-doped polysilicon, and then the polysilicon 11 is subsequently etched back again down to the first depth. This state of the method is shown in FIG. 6C.

The dielectric layer 10 can then be removed from the sidewalls of the trench hole DT in the upper region of the trench hole DT, that is to say in the region above the first polysilicon 11. Next, a so-called collar oxide 12 is deposited on the sidewall of the trench hole DT by means of CVD in the region above the dielectric layer 10. The collar oxide 12 is preferably composed of silicon oxide. After the deposition, the collar oxide 12 is etched back anisotropically. The collar oxide 12, also referred to as "thick oxide", primarily serves for preventing parasitic currents between the n-doped zone 9 and the selection transistor TR, described further below, of the memory cell M.

Figure 6D:
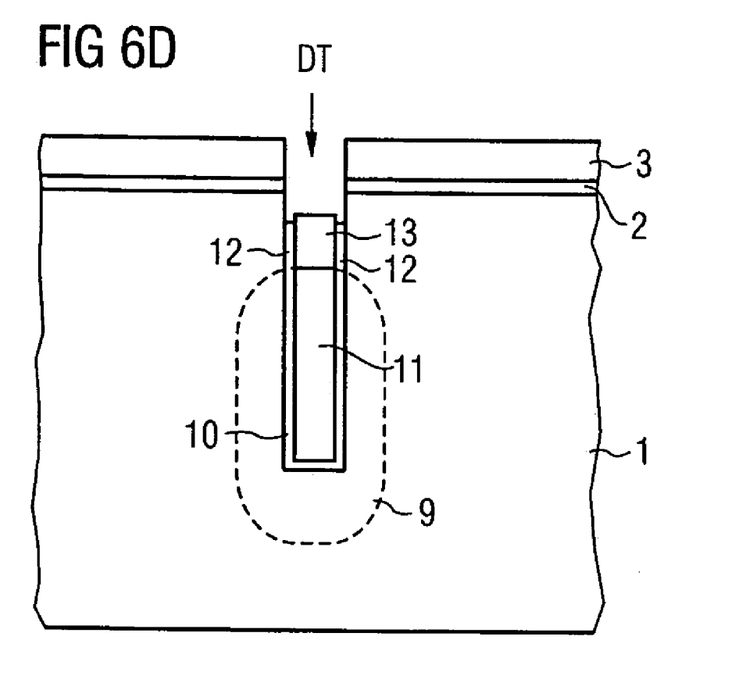

Next, a second polysilicon 13 is deposited into the trench hole DT and subsequently etched back down to a second depth below the silicon surface in a second recess step. Afterward, the collar oxide 12 is removed to below the upper edge of the second polysilicon 13. This state of the method is shown in FIG. 6D.

Figure 6E:
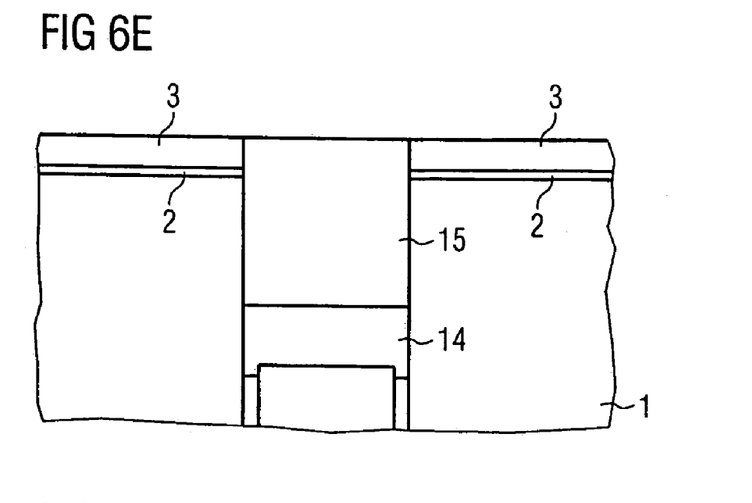

An n-doped third polysilicon 14 is deposited into the trench hole DT in a further method step. Arsenic-doped polysilicon is preferably used here. The third polysilicon 14 is etched back down to a third depth in the third recess step following thereupon. The trench hole DT is filled up with a filling material 15. This state of the method is shown in FIG. 6E.

Figure 6F:
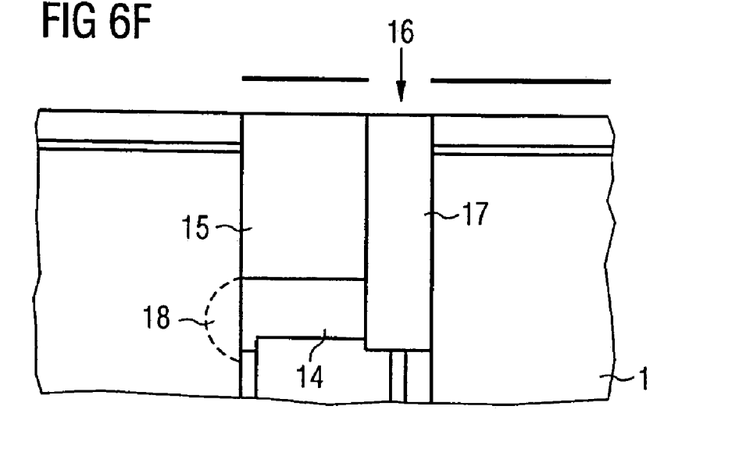

On the side, opposite the vertical selection transistor TR, of the trench hole DT, an isolation trench 16 is then etched down to a level below the upper edge of the second polysilicon 13 by means of a corresponding photomask, and subsequently filled up with insulating material 17. In the method step following thereupon, there is then produced in the semiconductor substrate 1 a diffusion area 18, the so-called buried strap region, that subsequently forms the lower source-drain electrode of the vertical selection transistor TR, and connects the inner electrode 9 of the trench transistor TC to a channel region BC. For this purpose, the buried strap region 18 is produced in a thermal outdiffusion process by outdiffusion from the n-doped third polysilicon 14. This state of the method is illustrated in FIG. 6F. This thermal outdiffusion process can, however, also be executed at a later point in time. The buried strap region 18 runs here along the trench hole DT, and preferably extends along the entire later channel region BC.

Figure 6G:
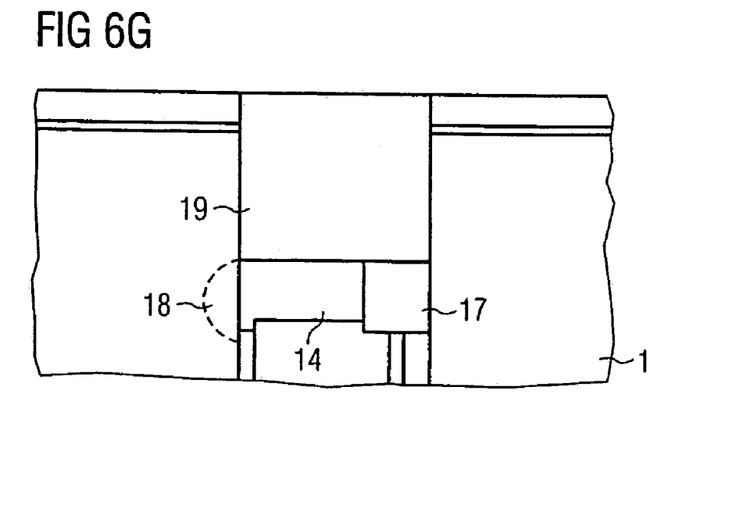

The filling material 15 above the third polysilicon 14 and the insulating material 17 in the isolating trench 16 are etched back down to a third depth, that is to say down to the upper edge of the third polysilicon 14, in a fourth recess step. The filling material 15 is completely removed in the process. The third polysilicon 14 may serve as an etching stop during this fourth recess step. Afterward, the etched-free upper region of the trench hole DT is filled with a protective material 19. This state of the method is illustrated in FIG. 6G.

Figure 6H:
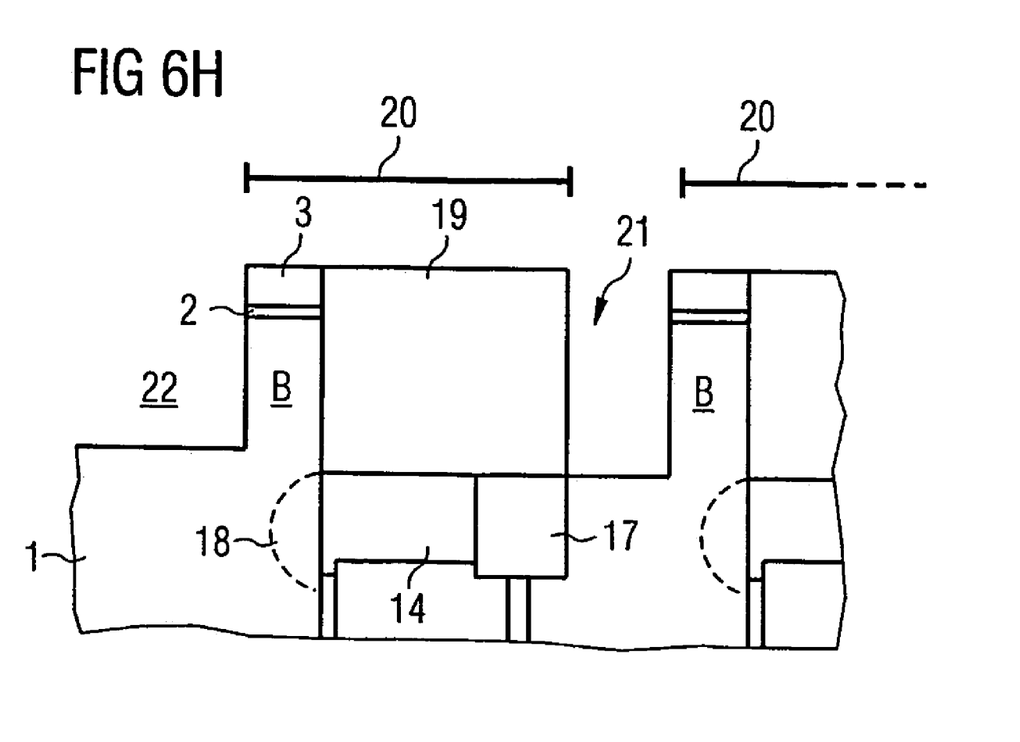

Next, recesses for accommodating the buried word lines WL are patterned. For this purpose, the silicon substrate 1 is etched selectively at locations 21 and 22 with the aid of a further photomask 20, the protective material 19 still remaining during this etching step. The semiconductor block B partially surrounding the trench hole DT is also left during this first etching step. The semiconductor block B will later serve as a channel region BC of the selection transistor TR, a conductive channel 35 being able to form in the interior of the semiconductor block B as a function of the potential of the associated word line WL. The state of the method after the first etching step is illustrated in FIG. 6H.

The protective material 19 is completely removed in a subsequent second etching step. The third polysilicon 14 serves as an etching stop during this second etching step. Recesses 24 for the word lines WL are completely etched away after this second etching step.

Figure 6I:
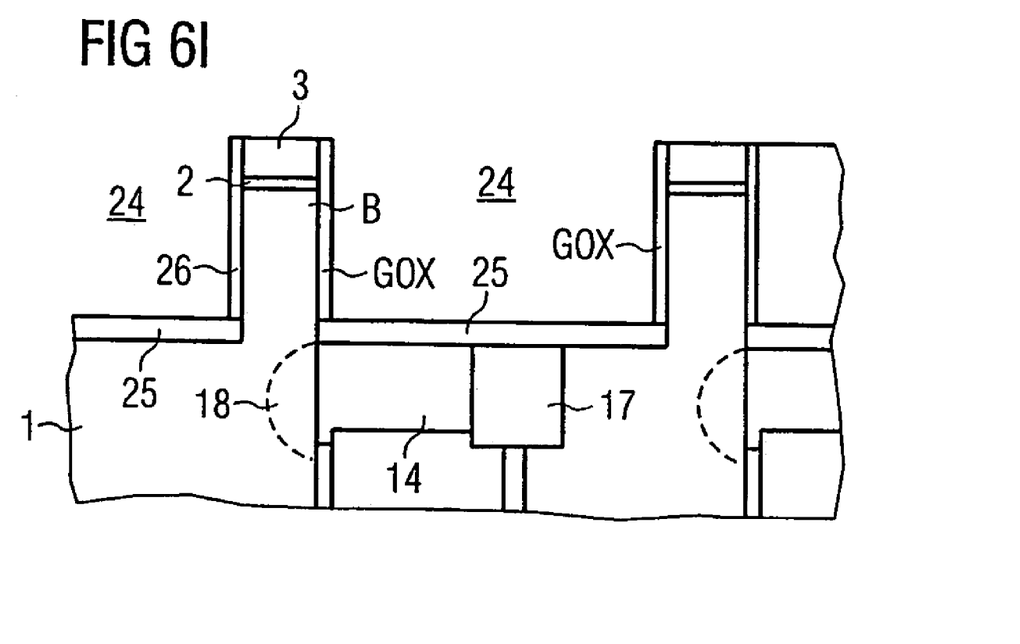

Thereupon, a cover oxide layer 25 is introduced into the recesses 24, said layer having the task of isolating the word line WL later produced from the semiconductor substrate 1. In order to produce the cover oxide layer 25, the recesses 24 are first filled with an oxide or with another insulating material by means of a CVD method (chemical vapor deposition). This insulating material is subsequently etched back until only the cover oxide layer 25 having the desired thickness is present. A gate oxide GOX is applied to the sidewalls of the recesses 24 in a thermal process. The gate oxide GOX is preferably a thin oxide produced thermally. The corresponding state of the method is shown in FIG. 6I.

Figure 6J:
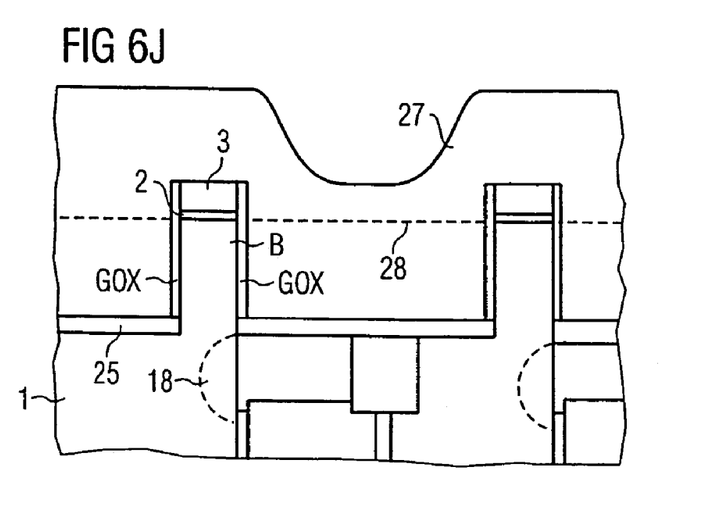
Figure 6K:
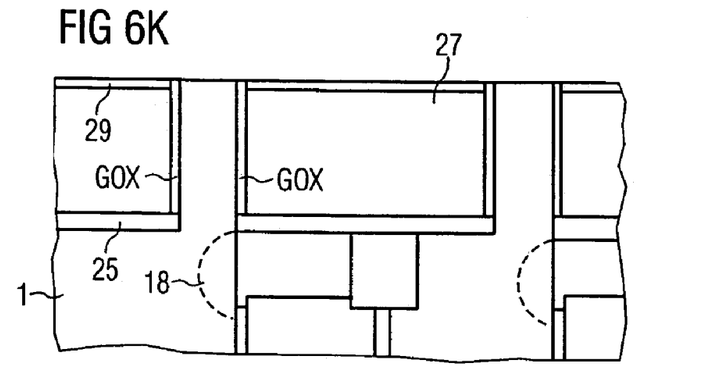
Figure 6L:
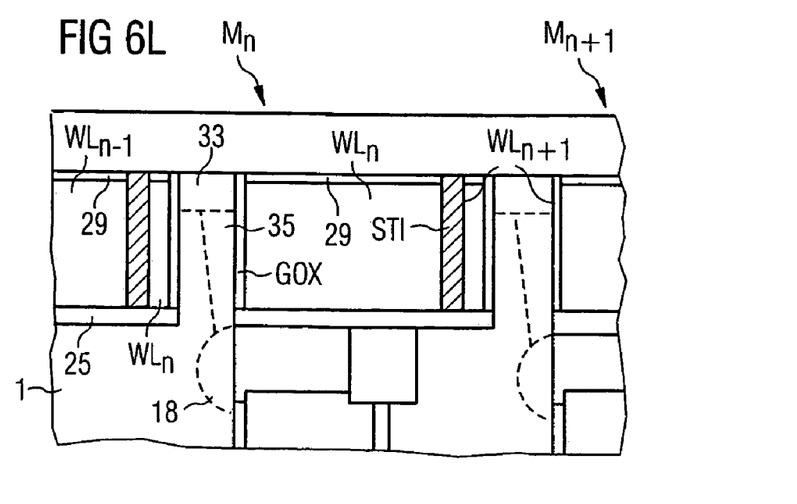

Next, conductive material for the word lines WL must be introduced into the recesses 24. In this case, the semiconductor blocks B are surrounded by the conductive material. In this exemplary variant method for patterning the word lines WL, which is illustrated in FIGS. 6J to 6L, firstly n-doped polysilicon 27 is deposited on the prepatterned substrate by means of a CVD method. This method state is illustrated in FIG. 6J.

Afterward, the substrate is ground plane by means of a chemical mechanical polishing method (CMP), to be precise such that the initially applied nitride layer 3 and also the thermal oxide layer 2 are concomitantly removed. The level to which the substrate is ground away is depicted as line 28 in FIG. 6J.

After the process of grinding plane, the polysilicon 27 is etched back to below the substrate surface. Insulating material 29 is subsequently deposited on the etched-back polysilicon 27, which now forms the word line layer, by means of CVD, to be precise preferably oxide or nitride. After the deposition of the insulating material, the substrate surface is again ground plane by means of chemical mechanical polishing (CMP) in order thus to pattern an insulating layer 29. This method state is illustrated in FIG. 6K.

Next, the individual word lines WL arranged next to one another must be electrically isolated from one another. For this purpose, with the aid of a mask step, isolation trenches STI for word line separation are etched from the n-doped polysilicon 27. In this case, the covering oxide layer 25 advantageously serves as an etching stop during the patterning of the isolation trenches STI. After etching, the isolation trenches STI are filled up with insulating material, preferably with oxide or nitride. FIG. 6L shows how the word line WL is isolated from a word line $WL_{n+1}$ assigned to a neighboring memory cell $M_{n+1}$ by means of an isolation trench STI. The isolation trench STI preferably runs here exactly in the middle relative to the two memory cells $M_n$, $M_{n+1}$.

In order to be able to make better contact connection with the semiconductor block B via the bit line BL situated thereabove, an n-doped region 33 may be produced in an upper region of the semiconductor block B by means of ion implantation.

As in previous methods, various metallization planes may then be applied to the substrate that has been prepatterned in this way. Bit lines BL which serve for the contact connection of the channel regions BC in the semiconductor blocks B are patterned directly on the substrate surface. Here, a bit line BL runs perpendicular to the word lines WL. This state of the method is illustrated in FIG. 6L.

Polysilicon was used as conductive material in the method for patterning the word lines WL presented with reference to FIGS. 6J to 6L. Alternatively, it is also possible to describe a method for patterning the word lines WL, in which, instead of polysilicon, a layer structure comprising polysilicon, titanium and tungsten is introduced into the recesses 24. This makes it possible to increase the conductivity of the word lines WL compared with the polysilicon solution.

The preceding description describes only advantageous exemplary embodiments of the invention. The features disclosed herein and in the claims and the drawings can therefore be essential both individually and in any desired combination for implementing the invention in its various embodiments.

What is claimed is:
1. A memory cell, comprising:
   a cylindrical trench capacitor formed in a lower portion of a trench hole, the cylindrical trench capacitor comprising:
   an inner electrode;
   an outer electrode; and
   a dielectric layer disposed between the inner electrode and the outer electrode; and
   a vertical selection transistor located above the cylindrical trench capacitor and comprising a first source-drain electrode, a second source-drain electrode and an interposed channel area formed between the source-drain electrodes, the first source-drain electrode being connected to the inner electrode of the trench capacitor, and the second source-drain electrode being connected to a bit line;
   wherein a conductive channel is formed in the channel area as a function of a potential of a word line in order to connect the inner electrode of the trench capacitor to the bit line;

wherein the channel area at least partially surrounds the trench hole without completely surrounding the trench hole;

wherein the trench hole is defined at least in part by two side walls arranged at an angle to one another; and wherein the channel area at least partially surrounds the two side walls of the trench hole.

2. The memory cell of claim 1, wherein the channel area extends beyond an upper end of the inner electrode.

3. The memory cell of claim 1, wherein the trench hole has a substantially polygonal cross section and wherein the two side walls of the trench hole meet at an angle to form an edge oriented substantially in the direction of the bit line and disposed substantially centrally below the bit line.

4. The memory cell of claim 1, wherein the inner electrode comprises a filling in the trench hole and wherein the outer electrode is formed around the trench hole.

5. The memory cell of claim 1, wherein the second source-drain electrode is a diffused portion of a substrate and is connected directly to the bit line.

6. The memory cell of claim 1, wherein the vertical selection transistor is located at the upper portion of the trench hole.

7. The memory cell of claim 1, wherein the bit line extends substantially in the center above the trench hole.

8. The memory cell of claim 1, wherein the first source-drain area is connected as a buried strap area with the inner electrode of the trench capacitor.

9. The memory cell of claim 1, wherein the word line is implemented as a buried word line in a substrate and which extends from a predetermined depth to an upper surface of the substrate.

10. The memory cell of claim 1, wherein the upper portion of the trench hole, which is partially surrounded by the channel area, is filled with a material which, due to at least one of its physical and electrical characteristics, influences the conductivity of the channel area.

11. The memory cell of claim 1, wherein the trench hole and the channel area have a substantially polygonal cross section.

12. The memory cell of claim 11, wherein the polygonal cross section is one of square and rectangular.

13. The memory cell of claim 1, wherein the channel area extends vertically through the word line.

14. The memory cell of claim 13, wherein the channel area is formed in a portion of a substrate.

* * * * *